United States Patent [19]

Harris et al.

[11] Patent Number: 4,780,792

[45] Date of Patent: Oct. 25, 1988

[54] SLIDING CIRCUIT CARD EJECTION APPARATUS AND METHOD

[75] Inventors: Allan E. Harris, Phoenix; Norman M. Atkin; Nicholas J. Wilt, both of Glendale, all of Ariz.

[73] Assignee: Honeywell Inc., Minneapolis, Minn.

[21] Appl. No.: 106,918

[22] Filed: Oct. 5, 1987

Related U.S. Application Data

[63] Continuation of Ser. No. 896,915, Aug. 15, 1986, abandoned.

[51] Int. Cl.⁴ .............................................. H05K 1/18
[52] U.S. Cl. .................................... 361/395; 361/386; 361/412; 361/413; 211/41
[58] Field of Search ............... 361/386, 388, 389, 394, 361/395, 412, 413, 414, 415; 211/41

[56] References Cited

U.S. PATENT DOCUMENTS

| | | | |
|---|---|---|---|
| T876,004 | 7/1970 | Andreini et al. | 339/17 R |
| 3,243,660 | 3/1966 | Yuska et al. | 361/388 |
| 3,451,034 | 6/1969 | Beale | 211/41 |
| 3,476,258 | 11/1969 | Dorcettt | 211/41 |
| 4,215,386 | 7/1980 | Prager et al. | 361/394 |
| 4,472,763 | 9/1984 | Loris | 211/41 X |
| 4,498,119 | 2/1985 | Cronin | 361/386 |
| 4,535,385 | 8/1985 | August et al. | 361/388 |
| 4,580,192 | 4/1986 | Beun | 361/415 X |
| 4,586,766 | 5/1986 | Hofmeister | 339/75 M X |
| 4,603,375 | 7/1986 | Miller et al. | 361/415 X |
| 4,638,405 | 1/1987 | Smith | 361/415 X |

FOREIGN PATENT DOCUMENTS 1332718  6/1963  France ................................. 211/41

Primary Examiner—R. R. Kucia
Attorney, Agent, or Firm—Seymour Levine; Albin Medved

[57] ABSTRACT

An electronic component module is mounted on a motherboard. An elongated slot is formed in the module. A pair of ejector handles are mounted with the slot. A first leg portion of each handle is mounted on one side of the slot and a second leg portion is mounted on an opposite side of the slot. Each handle has a first end including an aperture formed in each leg and a second end including a flange. A pin connection extends through the apertures and the slot for pivotally and slidably connecting the handle to the module. Each handle is slidably movable from a first end of the slot to a second end of the slot adjacent a supporting chassis. The handles can then be pivoted outwardly away from the module until contacting the chassis, and then urged downwardly into engagement with the chassis thus unseating and lifting the module from nested engagement with the motherboard.

5 Claims, 3 Drawing Sheets

SLIDING CIRCUIT CARD EJECTION APPARATUS AND METHOD

This application is a continuation of application Ser. No. 896,915, filed Aug. 15, 1986, now abandoned.

BACKGROUND OF THE INVENTION

1. Field of the Invention

This invention relates generally to electrical circuit boards or cards and more particularly to circuit card ejectors including devices used to apply a mechanical advantage to engage or disengage a circuit card assembly with a mated motherboard or matrix board.

2. Background of the Invention

Surface mount technology modules typically use two circuit card assemblies attached to opposite sides of an insulated metal core. The assemblies have a high component density which requires many electrical interconnects from one card to the other. These interconnects include a module connector which mates the bottom of the module with an associated motherboard, and a top test/crossover connector which makes test points and crossovers accessible at the top of the module.

A problem arises in that the top test/crossover connector is limited in size due to the presence of conventional circuit card ejectors connected to the top of each module. The ejectors require a substantial amount of space for storage at the top of the module. As a result, the amount of space used to store the ejectors depletes the amount of space needed to provide an adequate number of test points and crossovers.

The foregoing illustration limitations known to exist in present devices. Thus, it is apparent that it would be advantageous to provide an alternative directed to overcoming one or more of the limitations set forth above. Accordingly, a suitable alternative is provided including features more fully disclosed hereinafter.

SUMMARY OF THE INVENTION

In one aspect of the present invention, this is accomplished by providing a sliding circuit card ejector apparatus including an electronic component module having a portion provided with an elongated slot. Circuit card ejector means are pivotally and slidably mounted with the slot. The ejector means has a first leg portion mounted on one side of the slot and a second leg portion mounted on the other side of the slot. The first and second leg portions are interconnected by means provided to extend through the slot.

The foregoing and other aspects will become apparent from the following detailed description of the invention when considered in conjunction with the accompanying drawing. It is to be expressly understood, however, that the drawing is not intended as a definition of the invention but is for the purpose of illustration only.

DESCRIPTION OF THE PREFERRED EMBODIMENT

Figure 1:
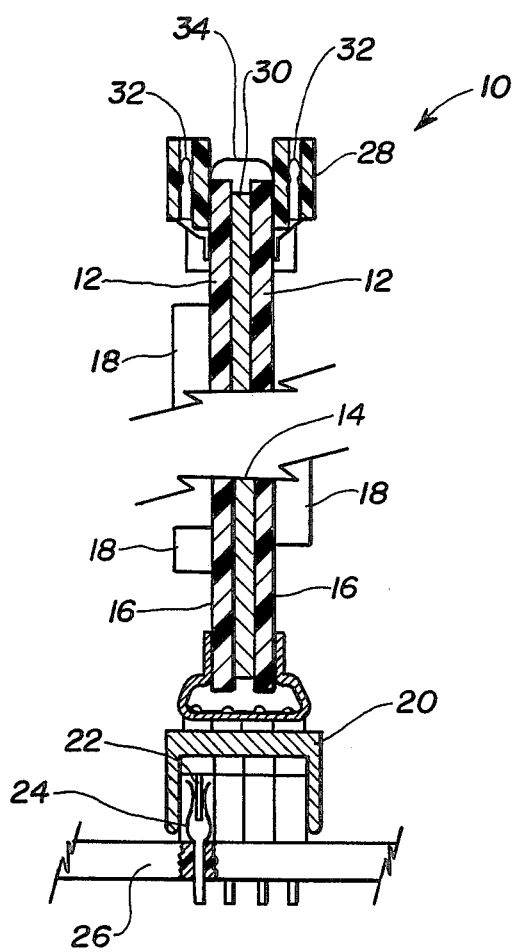
FIG. 1 is an end view in partial cross-section, illustrating an embodiment of a surface mount technology module used in connection with this invention.

An electronic component module is generally designated 10 in FIG. 1. Such modules are also referred to as surface mount technology (SMT) modules. Each module 10 includes two circuit card assemblies 12 (CCA), typically formed of a fiberglass material, and attached in back-to-back fashion to opposite sides of a typical insulated aluminum core 14. A surface 16 of each CCA 12 includes a plurality of well-known electronic components 18 such as integrated circuit (IC) chips. Each CCA 12 requires many common electrical interconnects. One such interconnect is a module connector 20, preferably formed of aluminum which interconnects one CCA 12 to the other and includes well-known male connectors 22 for nesting in mating engagement with well-known corresponding female connectors 24 of an associated motherboard 26 usually formed of a fiberglass material. Another interconnect is a well-known top test/crossover connector 28, preferably formed of a plastic material, adjacent a top edge surface 30 of metal core 14, which includes a plurality of top accessible, well-known test points 32 for each CCA 12 and also includes a CCA-to-CCA interconnect 34.

In FIGS. 2–5, an upper portion of module 10, including top edge surface 30, is partially shown adjacent a support chassis or structure 36 preferably formed of aluminum. An elongated, substantially vertical, slotted opening 38 is formed in metal core 14. Slot 38 has a first end 40 and a second end 42 adjacent edge 30. A pair of ejector handles 44, preferably formed of aluminum, are mounted on module 10 via slot 38. Since handles 44 are similar, only one of such handles 44 is hereinafter discussed in detail. Handle 44 includes a pair of legs 46 and an interconnecting flange 48. Each leg 46 has mutually aligned apertures 50 formed therethrough at a first end 52. Flange 48 interconnects legs 46 at a second end 54 of handle 44. Flange 48 includes an upper, substantially flat surface 56 and another surface 58, opposite flat surface 56 extending between legs 46. As shown, legs 46 extend substantially parallel in a first direction and flange 48 extends, in right angled fashion, in a second direction substantially normal to the first direction.

Figure 6:
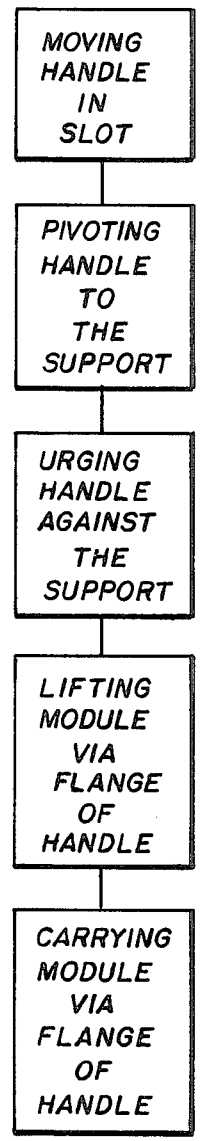
FIG. 6 is a diagrammatic view illustrating steps in the method of ejecting a module in accordance with the ejector of this invention.
Figure 2:
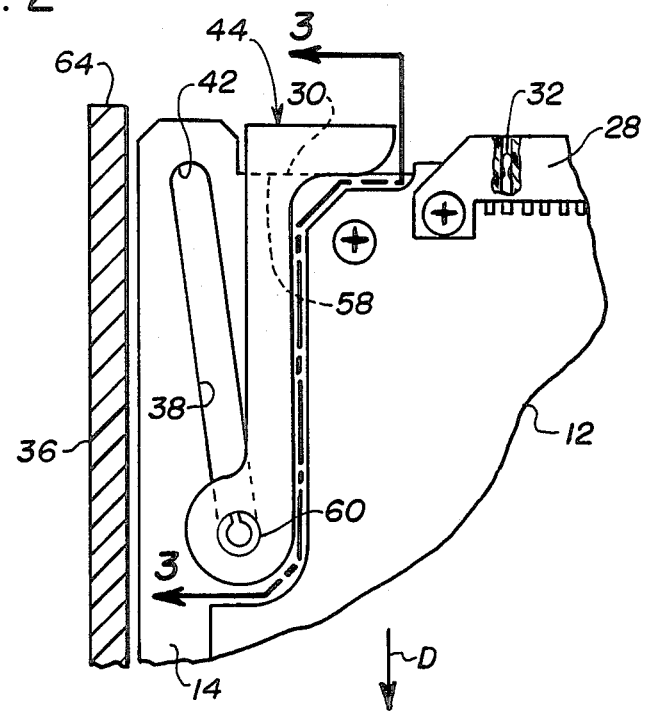
FIG. 2 is a partial side elevational view illustrating an embodiment of a vertically stowed circuit card ejector of this invention.
Figure 3:
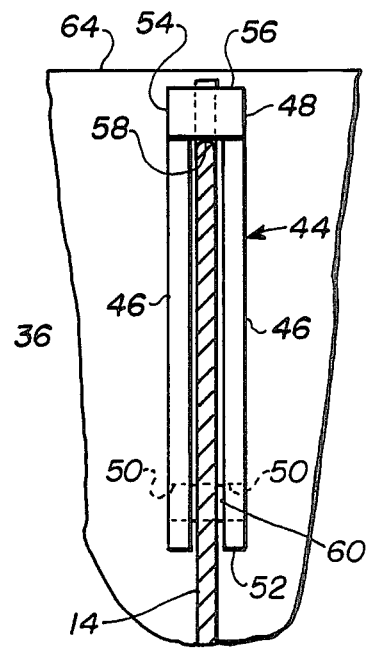
FIG. 3 is a view taken along line 3—3 of FIG. 2.
Figure 4:
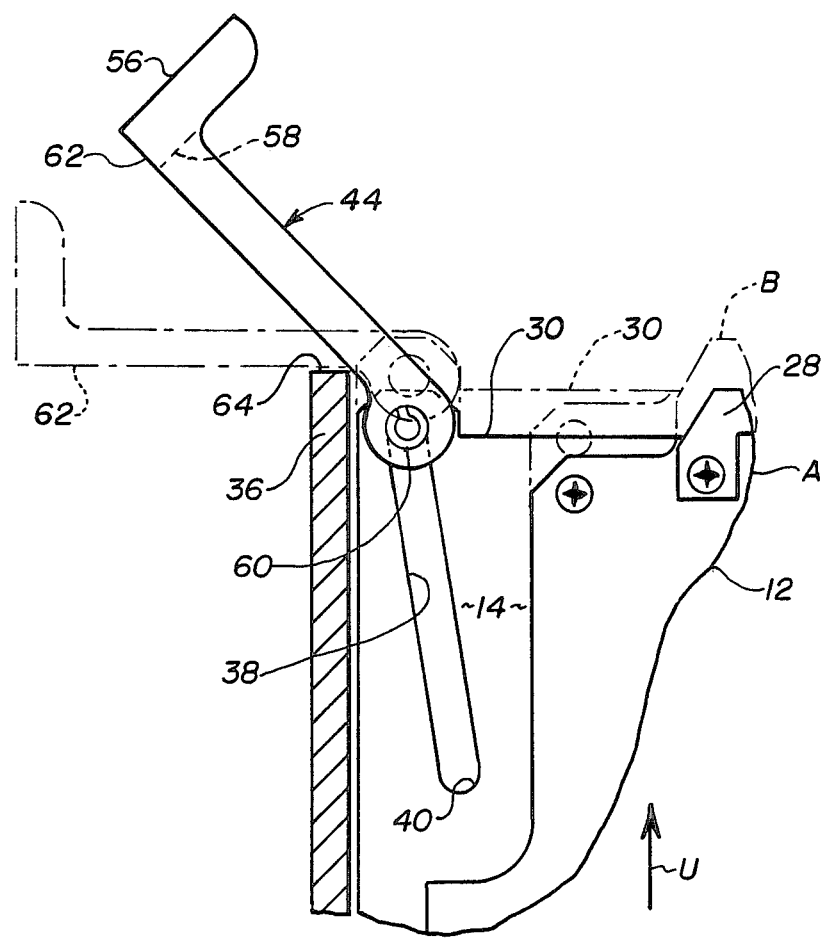
FIG. 4 is a partial side elevational view illustrating an embodiment of an extended and pivoted circuit card ejector of this invention.
Figure 5:
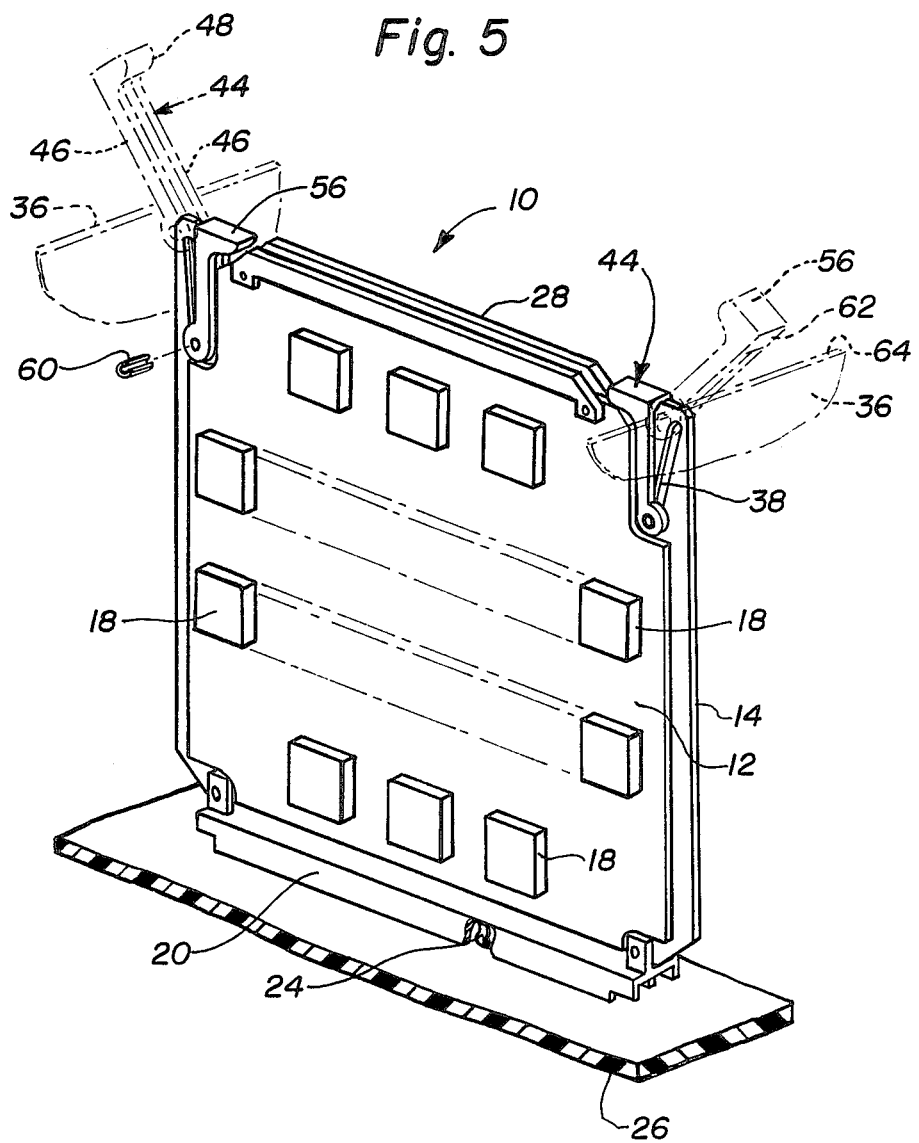
FIG. 5 is an isometric view illustrating an embodiment of the circuit card ejector of this invention in combination with a surface mount technology module.

Handle 44 is mounted on module 10 so that the respective legs 46 straddle metal core 14. In this manner, each leg 46 is on an opposite side of slot 38 from the other paired leg 46. Handle 44 is slidably and pivotally mounted on module 10 by inserting a well-known interconnecting steel spring pin 60 to extend through apertures 50 via slot 38. Handle 44 and slot 38 are constructed and positioned so that when handle 44 is in a vertically stored position, as shown in FIGS. 2 and 3, pin 60 rests at first end 40 of slot 38 and surface 58 of flange 48 engages edge 30 of metal core 14. Furthermore, surface 56 is positioned to receive a downward force to be applied thereto for engaging male and female connectors 22, 24, respectively; and seating module 10 on motherboard 26. Handle 44 and slot 38 are further constructed and positioned so that when handle 44 is slidably moved (see also FIGS. 4, 5 and 6) to a position wherein pin 60 is at second end 42 of slot 38, handle 44 is free to pivot away from module 10 so that a surface 62 of handle 44 engages a surface 64 of structure 36 which is adjacent second end 42 of slot 38.

A downward force, indicated by a directional arrow designated D, applied to handle 44, urges surface 62 into engagement with surface 64 resulting in an opposite reaction in that a resultant upward force, indicated by a directional arrow designated U, urges module 10 from a solid line position A (FIG. 4), wherein module 10 is seated in nested engagement with motherboard 26, to a dotted line position B wherein module 10 becomes unseated with respect to motherboard 26. Furthermore, using flanges 48 as a handhold, a lifting force applied to handle 44, facilitates lifting module 10 from the motherboard 26 and thereafter flanges 48 can be further used as a handhold for carrying module 10.

The foregoing has described a circuit card ejector which slides in a substantially vertical direction and stores in a vertical position so as to occupy less space on the top edge of an electronic component module. When fully extended, the ejector pivots against the supporting chassis structure to eject the module by disengaging the module connector from the motherboard. Vertical storage of the ejector consumes less space at the top of the module thus permitting a larger top test/crossover connector to provide an adequate number of test points and crossovers.

In the extended position, the ejector provides a lever advantage equal to or better than conventional ejectors. Since the ejector pivots against the chassis structure, ejector lands required for conventional ejectors can be avoided thus simplifying the chassis structure. In the stowed or stored position, a flange surface of the ejector can be used to apply force for engaging the module connector with the motherboard. Once ejected, the flange also acts as a handhold for lifting and carrying the module.

Having thus described the invention, what is claimed is:

1. An apparatus for removing an electronic component module from a mother board comprising:

a core in said electronic component module positioned between two circuit element bearing cards forming an integral part thereof and movable therewith, said core having first and second sides, a longitudinal dimension along an axis perpendicular to said mother board, and a closed slot therein extending through said first, second sides, said slot having a length and a width less than said length, a first end adjacent a surface of said component module, and linearly extending therefrom to a second end at a predetermined distance along said axis from said surface;

first and second legs positioned adjacent said first and second sides, each having a first end section with an aperture therein and a second end section;

means slideably positioned in said slot for movement along said slot between said first and second ends, said slideably positioned means extending through said apertures for connecting said first and second legs; and means for interconnecting said second end sections of said first and second legs.

2. The apparatus of claim 1 wherein said interconnecting means forms a surface between said first and second legs and includes a flange perpendicularly extending from said legs.

3. The apparatus of claim 2 wherein said core has an edge adjacent said first end of said slot and wherein said flange has means for engagement with said edge, such that said electronic component package is locked in place by said engagement when said coupling means is positioned at said second end of said slot.

4. The apparatus of claim 3 wherein said mother board is mounted on a chasis including a wall having a surface and extending from said mother board adjacent said electronic package module, when mounted in said mother board, such that said surface of said wall is adjacent said first end of said slot said slot and said wall constructed and arranged so that said electronic package is removable from said mother board by sliding said connecting means to said first end and pivoting said legs to engage said surface formed by said interconnecting means with said surface of said wall.

5. The apparatus of claim 4 wherein said connecting means is a spring pin.

* * * * *